(12) United States Patent
Kumeta et al.

(10) Patent No.: US 9,645,389 B2
(45) Date of Patent: May 9, 2017

(54) LIGHT GUIDING DEVICE, METHOD FOR PRODUCING SAME, AND LD MODULE

(71) Applicant: FUJIKURA LTD., Tokyo (JP)

(72) Inventors: Shohei Kumeta, Sakura (JP); Shinichi Sakamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/424,335

(22) PCT Filed: Aug. 13, 2013

(86) PCT No.: PCT/JP2013/071847
§ 371 (c)(1),
(2) Date: Feb. 26, 2015

(87) PCT Pub. No.: WO2014/034428
PCT Pub. Date: Mar. 6, 2014

(65) Prior Publication Data
US 2015/0219890 A1    Aug. 6, 2015

(30) Foreign Application Priority Data

Aug. 29, 2012 (JP) ................................ 2012-189204

(51) Int. Cl.
*G02B 26/08* (2006.01)
*G02B 6/42* (2006.01)
(Continued)

(52) U.S. Cl.
CPC ........... *G02B 26/0816* (2013.01); *G02B 6/42* (2013.01); *G02B 6/4204* (2013.01);
(Continued)

(58) Field of Classification Search
CPC ...... G02B 26/08; G02B 6/42; G02B 26/0816; G02B 6/4296; G02B 6/4214;
(Continued)

(56) References Cited

U.S. PATENT DOCUMENTS

| 4,826,269 A | 5/1989 | Streifer et al. |
| 5,513,201 A | 4/1996 | Yamaguchi et al. |

(Continued)

FOREIGN PATENT DOCUMENTS

| CN | 1164657 A | 11/1997 |
| CN | 1519613 A | 8/2004 |

(Continued)

OTHER PUBLICATIONS

Office Action dated Sep. 24, 2015, issued in counterpart Chinese Application No. 201380044951.2. (11 pages).
(Continued)

*Primary Examiner* — Jennifer L. Doak
(74) *Attorney, Agent, or Firm* — Westerman, Hattori, Daniels & Adrian, LLP

(57) ABSTRACT

A light-guiding device that converts an input beam bundle made of a plurality of laser beams that have respectively been emitted from a plurality of LD elements, to an output beam bundle made of a plurality of output beams, includes a plurality of double mirrors each corresponding to a corresponding one of the LD elements LDi, the double mirrors being separated from one another. The double mirrors Mi each are made of a first mirror Mi1 that is mounted on a top surface of a base plate B and a second mirror Mi2 that is mounted on a top surface the first mirror Mi1. The first mirror has a first reflective surface whose normal makes an angle of 45° with a normal of the top surface of the base plate. The second mirror has a second reflective surface whose normal makes an angle of 135° with the normal of the top surface of the base plate. The laser beams respectively emitted from the LD elements respectively corresponding to the double mirrors each are first reflected by the first reflective surface and then further reflected by the second reflective surface. By adjusting orientations and positions of
(Continued)

the first mirror and the second mirror, it is possible to adjust a propagation direction of each of the output beams.

14 Claims, 14 Drawing Sheets

(51) Int. Cl.
  *H01S 5/00* (2006.01)
  *H01S 5/40* (2006.01)
  *H01S 5/022* (2006.01)

(52) U.S. Cl.
  CPC ......... *G02B 6/4214* (2013.01); *G02B 6/4296* (2013.01); *H01S 5/0071* (2013.01); *H01S 5/4012* (2013.01); *H01S 5/005* (2013.01); *H01S 5/02248* (2013.01); *H01S 5/02284* (2013.01); *H01S 5/4031* (2013.01)

(58) Field of Classification Search
  CPC ....... G02B 6/4204; H01S 5/00; H01S 5/0071; H01S 5/4012; H01S 5/02248; H01S 5/02284; H01S 5/4031
  See application file for complete search history.

(56) References Cited

U.S. PATENT DOCUMENTS

| | | |
|---|---|---|
| 5,629,791 A | 5/1997 | Harrigan |
| 5,808,323 A | 9/1998 | Spaeth et al. |
| 5,877,898 A | 3/1999 | Hollemann et al. |
| 6,124,973 A | 9/2000 | Du et al. |
| 6,922,288 B2 | 7/2005 | Yamanaka et al. |
| 7,286,308 B2 | 10/2007 | Kennedy |
| 7,339,975 B2 | 3/2008 | Yamanaka et al. |
| 2002/0051360 A1 | 5/2002 | Solodovnikov et al. |
| 2002/0090172 A1 | 7/2002 | Okazaki et al. |
| 2004/0095969 A1 | 5/2004 | Kaji et al. |
| 2004/0233964 A1 | 11/2004 | Yamanaka et al. |
| 2004/0252388 A1 | 12/2004 | Yamanaka et al. |
| 2004/0264862 A1 | 12/2004 | Nagano |
| 2006/0274434 A1 | 12/2006 | Mino et al. |
| 2007/0237455 A1 | 10/2007 | Sonoda et al. |
| 2008/0101429 A1 | 5/2008 | Sipes |
| 2009/0129420 A1 | 5/2009 | Regaard et al. |
| 2009/0245315 A1 | 10/2009 | Faybishenko |
| 2011/0103409 A1 | 5/2011 | Sipes, Jr. |
| 2012/0018412 A1 | 1/2012 | Ito |
| 2013/0170791 A1 | 7/2013 | Kasahara et al. |
| 2013/0194801 A1 | 8/2013 | Wolf et al. |
| 2015/0280404 A1 | 10/2015 | Kasai et al. |
| 2016/0252679 A1 | 9/2016 | Sakamoto et al. |

FOREIGN PATENT DOCUMENTS

| | | |
|---|---|---|
| CN | 1521963 A | 8/2004 |
| CN | 1553240 A | 12/2004 |
| CN | 102401949 A | 4/2012 |
| CN | 202383321 U | 8/2012 |
| DE | 198 41 040 A1 | 3/1999 |
| DE | 10 2007 002 498 A1 | 1/2008 |
| EP | 0 660 157 A1 | 6/1995 |
| EP | 2 061 122 A1 | 5/2009 |
| JP | 61-212819 A | 9/1986 |
| JP | 63-113509 A | 5/1988 |
| JP | 5-15009 U | 2/1993 |
| JP | 7-98402 A | 4/1995 |
| JP | 7-199117 A | 8/1995 |
| JP | 8-271832 A | 10/1996 |
| JP | 10-510933 A | 10/1998 |
| JP | 2001-215443 A | 8/2001 |
| JP | 2002-202442 A | 7/2002 |
| JP | 2003-309309 A | 10/2003 |
| JP | 2004-145136 A | 5/2004 |
| JP | 2004-252428 A | 9/2004 |
| JP | 2004-258624 A | 9/2004 |
| JP | 2005-309370 A | 11/2005 |
| JP | 2007-19301 A | 1/2007 |
| JP | 2009-520353 A | 5/2009 |
| JP | 2009-170881 A | 7/2009 |
| JP | 2010-91658 A | 4/2010 |
| JP | 2011-107723 A | 6/2011 |
| JP | 2012-24784 A | 2/2012 |
| JP | 2012-58409 A | 3/2012 |
| WO | 02/50599 A1 | 6/2002 |
| WO | 2007/078456 A1 | 7/2007 |
| WO | 2012/004381 A2 | 2/2012 |

OTHER PUBLICATIONS

Japanese Office Action dated Feb. 9, 2016, issued in counterpart Japanese Patent Application No. 2015-090869 (3 pages).
Office Action dated Jun. 9, 2015, issued in Japanese application No. 2014-524182 (1 page).
Extended European Search Report dated Aug. 12, 2015, issued in counterpart European Patent Application No. 13832216.9 (5 pages).
JP Office Action of corresponding JP2014-524182 dated Aug. 26, 2014 with English translation (6 pages).
JP Office Action of corresponding JP2014-524182 dated Nov. 11, 2014 with English translation (7 pages).
JP Office Action of corresponding JP2014-524182 dated Jan. 27, 2015 with English translation (8 pages).
International Search Report dated Sep. 17, 2013 issued in corresponding application No. PCT/JP2013/071847.
Office Action dated Jun. 8, 2016, issued in counterpart Chinese Patent Application No. 201380044951.2. (12 pages).
Notice of Allowance dated Apr. 26, 2016, issued in counterpart Japanese Patent Application No. 2015-090869, with English translation. (4 pages).
Office Action dated Aug. 2, 2016, issued in Japanese Patent Application No. 2015-054018, with English translation.
Office Action for Japanese Application No. 2012-286085, dated Oct. 28, 2014 with English translation.
Notice of Allowance for Japanese Application No. 2012-286085, dated Feb. 24, 2015 with English translation.
International Search Report dated Nov. 5, 2013, issued in corresponding application No. PCT/JP2013/075814.
Office Action dated Sep. 28, 2015, issued in counterpart Chinese Patent Application No. 201380053399.3 (6 pages).
Japanese Office Action dated Dec. 15, 2015 (mailing date), issued in counterpart Japanese Patent Application No. 2015-054018 with English translation.
European Search Report dated Jan. 7, 2016, issued in counterpart European Patent Application No. 13869600.0.
Office Action for Japanese Application No. 2012-286085, dated Jun. 24, 2014 with English translation.
Final Rejection Office Action dated Sep. 29, 2016, issued in U.S. Appl. No. 14/435,226 (34 pages).
Non-Final Rejection Office Action dated Jan. 20, 2016, issued in U.S. Appl. no. 14/435,226 (31 pages).
Related co-pending U.S. Appl. No. 14/435,226.
U.S. Non-Final Office Action dated Mar. 1, 2017, issued in U.S. Appl. No. 14/435,226.
Japanese Notice of Allowance dated on Feb. 7, 2017, issued in Japanese Patent Application No. 2015-054018 with an English translation.

LIGHT GUIDING DEVICE, METHOD FOR PRODUCING SAME, AND LD MODULE

TECHNICAL FIELD

The present invention relates to a light-guiding device that converts an input beam bundle made of a plurality of input beams to an output beam bundle made of a plurality of output beams. The present invention also relates to a method of producing such a light-guiding device and to an LD module including such a light-guiding device.

BACKGROUND ART

LD modules are widely used for the purpose of coupling a laser beam emitted from an LD (Laser Diode) element (semiconductor laser element) to an optical fiber. Among such LD modules, a micro-optical device disclosed in Patent Literature 1 has been known as a light-guiding device that guides a laser beam emitted from each of a plurality of LED elements to an optical fiber.

FIG. 14 is a perspective view of a micro-optical device 10 disclosed in Patent Literature 1. As illustrated in FIG. 14, the micro-optical device 10 includes a base plate 11, an LD bar 12, a cylindrical lens 13, a first mirror row 14, and a second mirror row 15.

The LD bar 12 includes a plurality of LD elements aligned along an x axis and emits laser beams in a z-axis positive direction from the plurality of LD elements, respectively. The laser beams emitted in the z-axis positive direction from the plurality of LD elements, respectively, have respective optical axes that are aligned along the x axis within a first plane parallel to a zx plane.

Note that propagation directions of the laser beams emitted from the LD elements, respectively, are dispersed in directions in a range of ±θx around the z-axis positive direction at the center. On this account, the micro-optical device 10 is arranged such that the laser beams emitted from the LD elements, respectively, are collimated by the cylindrical lens 13 that is provided so as to face an emission edge surface of the LD bar 12 (i.e., the propagation directions are converged in the z-axis positive direction).

The first mirror row 14 is a mirror row in which mirror surfaces 14a are combined. The mirror surfaces 14a are opposed to the LD elements, respectively, which constitute the LD bar 12. Each of the laser beams emitted from the LD elements in the z-axis positive direction, respectively, is reflected into a y-axis positive direction by a corresponding mirror surface 14a which is opposed to a corresponding one of the LD element. Meanwhile, the second mirror row 15 is a mirror row in which mirror surfaces 15a are combined. The mirror surfaces 15a are opposed to the mirror surfaces 14a, respectively, which constitute the first mirror row 14. Each of the laser beams having been reflected into the y-axis positive direction by the mirror surfaces 14a, respectively, is further reflected into an x-axis positive direction by a corresponding mirror surface 15a which is opposed to one of the mirror surface 14a that has reflected the laser beam.

Note that, mirror surfaces 14a and 15a that reflect a laser beam emitted from an (i+1)th LD element (as counted in a direction from an x-axis positive side to an x-axis negative side) are provided on a z-axis negative direction side of mirror surfaces 14a and 15b that reflect a laser beam emitted from an i-th LD element (as counted in the direction from the x-axis positive side to the x-axis negative side). On this account, optical axes of the laser beams reflected by the mirror surfaces 15a are aligned along a z axis in a second plane that is parallel to the zx plane. This second plain is at a position on a y-axis positive direction side of the first plane as described above.

In this way, the micro-optical device 10 functions to convert a first beam bundle made of laser beams propagating in the z-axis positive direction in which the laser beams are emitted from the LD elements constituting the LD bar 12, to a second beam bundle made of laser beams propagating in an x-axis direction into which the laser beams are reflected by the mirror surfaces 15a constituting the second mirror row 15. The second beam bundle that is to be outputted from the micro-optical device 10 (hereinafter, referred to as "output beam bundle") is converged on an incident edge surface of an optical fiber by, for example, a lens (not illustrated).

CITATION LIST

Patent Literature

Patent Literature 1
Japanese Patent Application Publication, Tokukai, No. 2004-252428 (Publication Date: Sep. 9, 2004)

SUMMARY OF INVENTION

Technical Problem

However, in the conventional micro-optical device 10, it is inevitable that propagation directions of laser beams constituting an output beam bundle vary in a case where propagation directions of laser beams emitted from respective LD elements vary (the propagation directions are unevenly inclined). This is because the propagation directions of the laser beams constituting the output beam bundle cannot be individually adjusted due to a configuration in which the mirror surfaces 14a for reflecting the laser beams emitted from the LD elements are combined as the mirror row 14 and the mirror surfaces 15a for further reflecting the laser beams are combined as the mirror row 15. Variation of the propagation directions of the laser beams constituting the output beam bundle makes it difficult to converge the output beam bundle on an incident edge surface of an optical fiber, and consequently becomes a factor that hinders realization of a higher output and a higher efficiency.

This problem is particularly prominent in a multi-chip LD module. The multi-chip LD module indicates an LD module that has, as a light source, a plurality of LD chips each including one LD element. It is apparent that, in such a multi-chip LD module that requires mounting each LD chip individually, variation of propagation directions of laser beams emitted from respective LD chips easily occurs.

Note that in a case where inclinations of the propagation directions of the laser beams emitted from the LD elements, respectively, are uniform, it is possible to make laser beams constituting the output beam bundle to propagate in a predetermined direction by adjusting an inclination of the mirror row 14. However, it is difficult to maintain such an inclination of the mirror row 14, for the following reason.

That is, it is difficult to maintain the inclination because a thickness of an adhesive layer interposed between the mirror row 14 and the base plate 11 needs to be made non-uniform in a case where the mirror row 14 in an inclined state is adhered to the base plate 11. Accordingly, when the adhesive layer is cured, non-uniform cure shrinkage occurs. This consequently changes the inclination of the mirror row 14. Further, even after the adhesive layer is cured, non-uniform thermal expansion/thermal shrinkage occurs in accordance with a temperature increase/temperature decrease. This consequently changes the inclination of the mirror row 14. The present invention is attained in view of the above problems. An object of the present invention is to provide (i) a light-guiding device that converts an input beam bundle made of a plurality of input beams to an output beam bundle made of a plurality of output beams, which light-guiding device is capable of adjusting propagation directions of the output beams into a predetermined direction even in a case where propagation directions of the input beams are inclined non-uniformly or uniformly, and also (ii) an LD module capable of realizing a higher output and a higher efficiency by use of the light-guiding device.

Solution to Problem

A light-guiding device of the present invention that converts an input beam bundle made of a plurality of input beams to an output beam bundle made of a plurality of output beams, includes: double mirrors each corresponding to a corresponding one of the input beams, the double mirrors each being separated from the other double mirrors each corresponding to another one of the input beams, the double mirrors respectively corresponding to the input beams each being made of a first mirror that is mounted on a specific flat surface and a second mirror that is mounted on the first mirror, the first mirror having a first reflective surface whose normal makes an angle of 45° with a normal of the specific flat surface, the first reflective surface reflecting a corresponding one of the input beams, the second mirror having a second reflective surface whose normal makes an angle of 135° with the normal of the specific flat surface, the second reflective surface reflecting the corresponding one input beam that has been reflected by the first reflective surface.

In the above configuration, the first reflective surface for reflecting a corresponding one of the input beams is provided to the first mirror mounted on the specific flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror.

Moreover, in the above configuration, the double mirrors each correspond to a corresponding one of the input beams. Further, each of these double mirrors is separated from the other double mirrors each corresponding to another one of the input beams. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

The scope of the present invention encompasses an LD module including the light-guiding device.

It becomes possible to provide an LD module capable of realizing a higher output and a higher efficiency, by including the light-guiding device.

Advantageous Effects of Invention

The present invention makes it possible to provide (i) a light-guiding device capable of adjusting propagation directions of output beams into a predetermined direction even in a case where propagation directions of the input beams are inclined non-uniformly or uniformly, and also (ii) an LD module capable of realizing a higher output and a higher efficiency by use of the light-guiding device.

Figure 6:
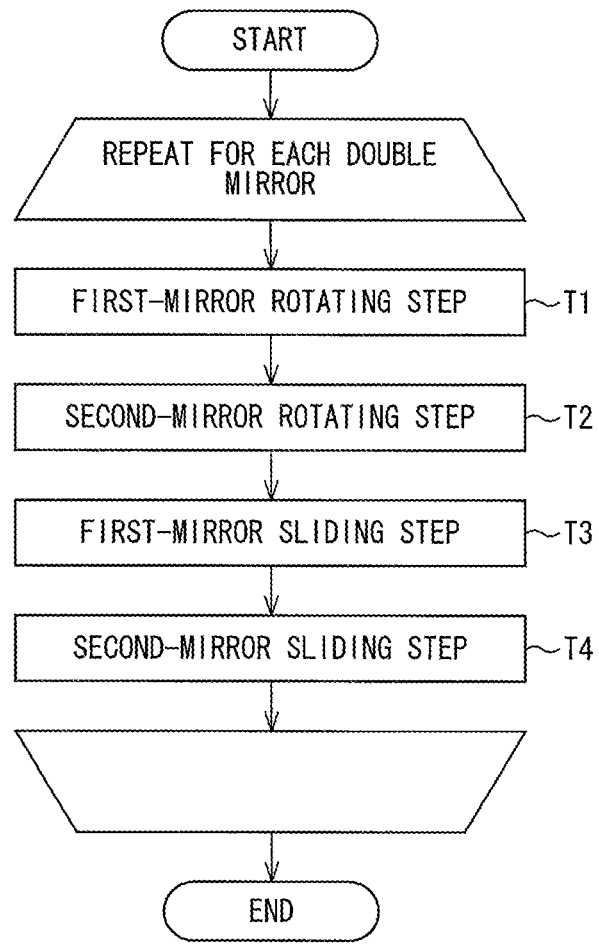
FIG. 6 is a flow chart illustrating a method of adjusting orientations and positions of the first mirror and the second mirror provided in the double mirror illustrated in FIG. 3.
Figure 7:
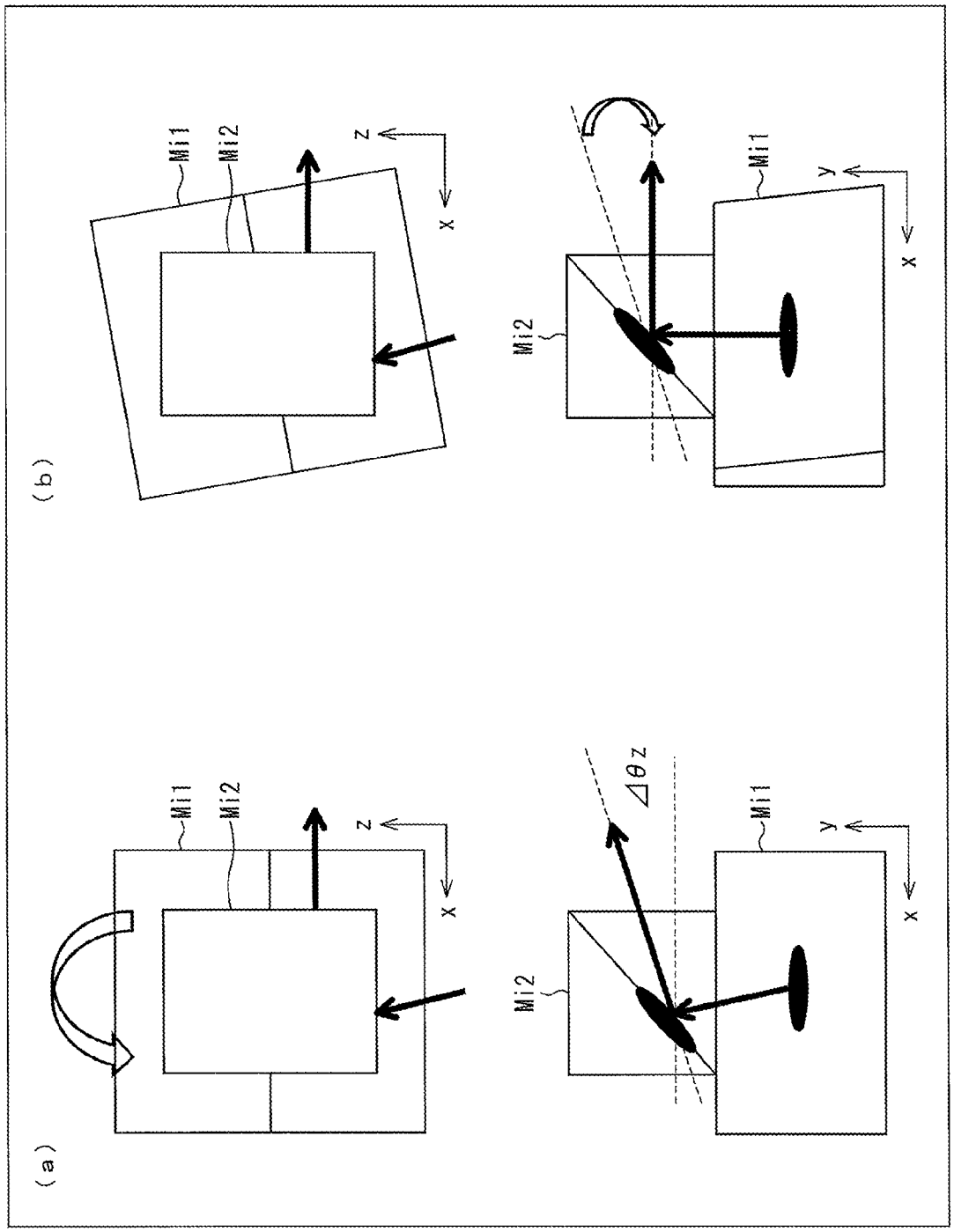

(a) of FIG. 7 is a top view (upper part) and a front view (lower part) each illustrating, as an example, a state of the double mirror prior to a first-mirror rotating step in the flow chart of FIG. 6. (b) of FIG. 7 is a top view (upper part) and a front view (lower part) each illustrating, as an example, a state of the double mirror after the first-mirror rotating step.

Figure 8:
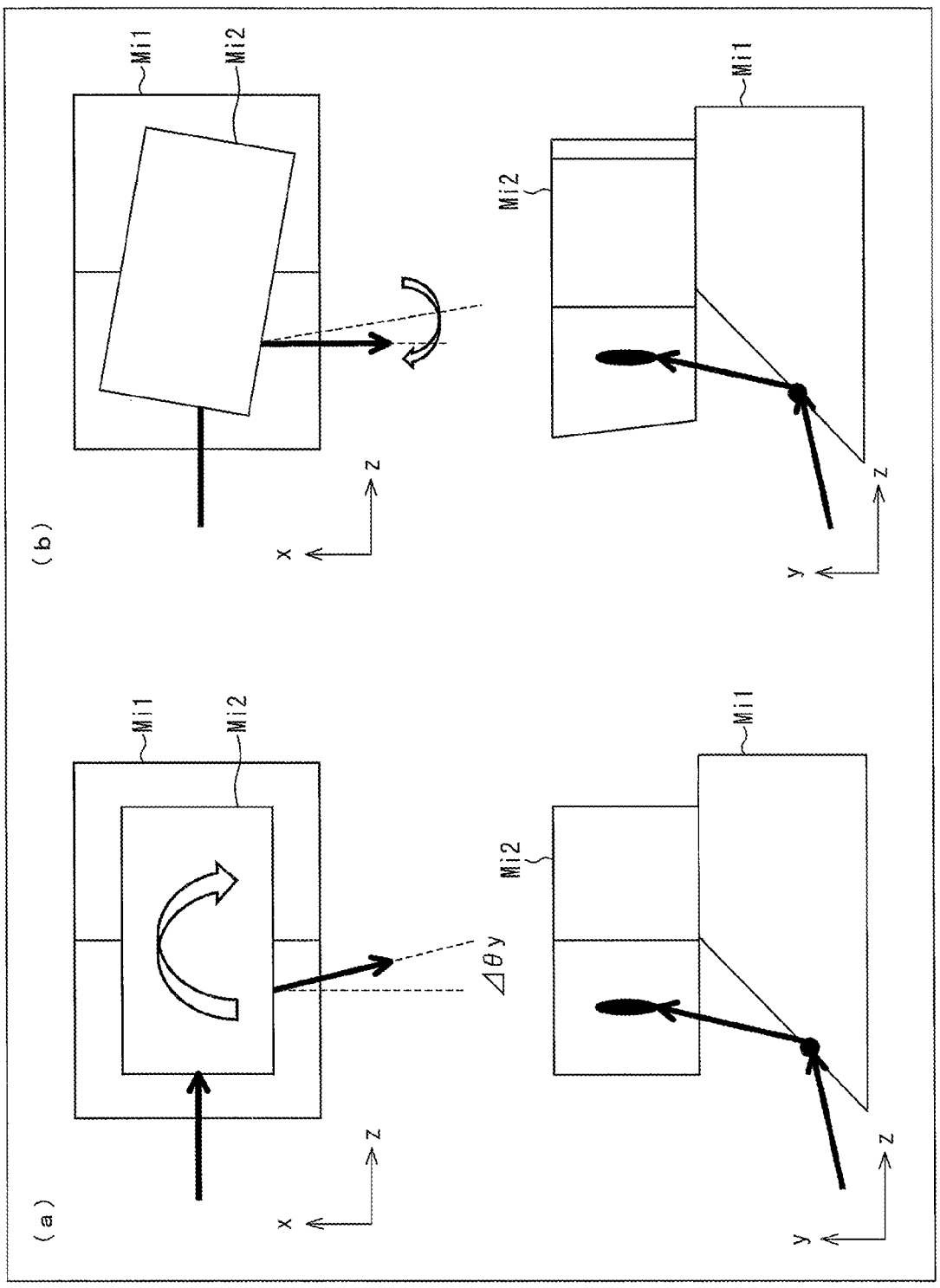

(a) of FIG. 8 is a top view (upper part) and a side view (lower part) each illustrating, as an example, a state of the double mirror prior to a second-mirror rotating step in the flow chart of FIG. 6. (b) of FIG. 8 is a top view (upper part) and a side view (lower part) each illustrating, as an example, a state of the double mirror after the second-mirror rotating step.

Figure 9:
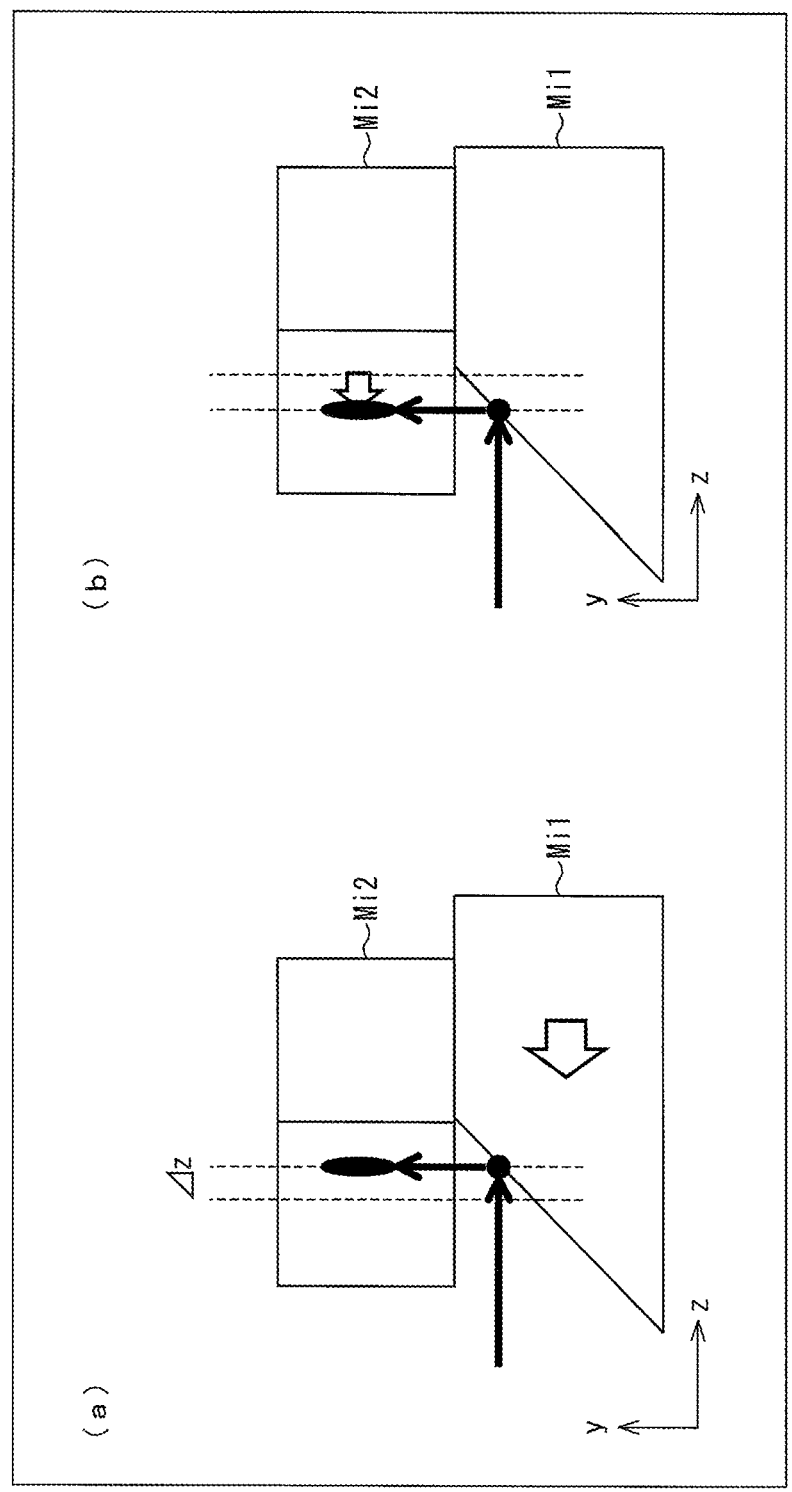

(a) of FIG. 9 is a side view illustrating, as an example, a state of the double mirror prior to a first-mirror sliding step in the flow chart shown in FIG. 6. (b) of FIG. 9 is a side view illustrating, as an example, a state of the double mirror after the first-mirror sliding step.

Figure 10:
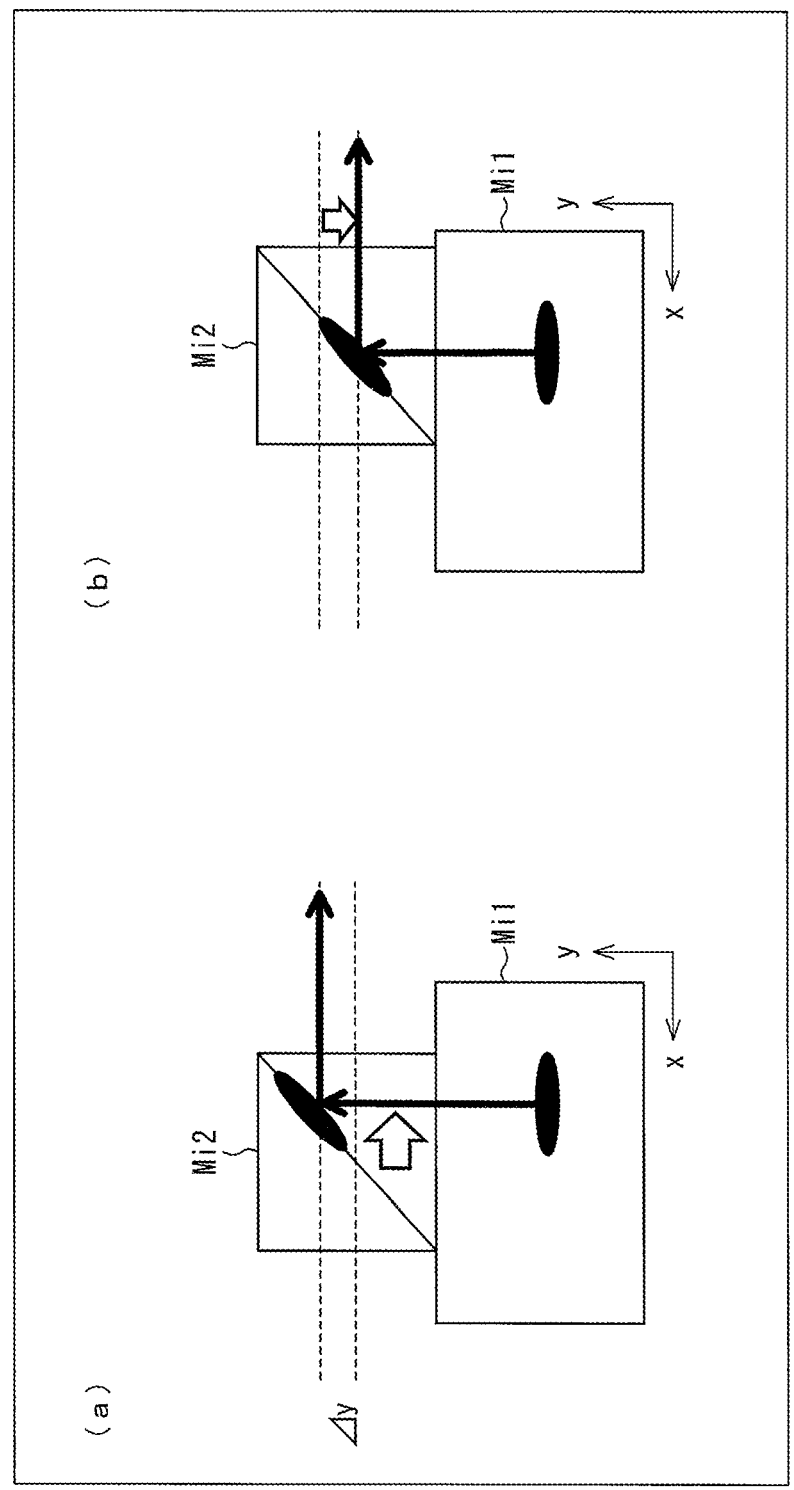

(a) of FIG. 10 is a front view illustrating, as an example, a state of the double mirror prior to a second-mirror sliding step in the flow chart shown in FIG. 6. (b) of FIG. 10 is a front view illustrating, as an example, a state of the double mirror after the second-mirror sliding step.

Figure 11:
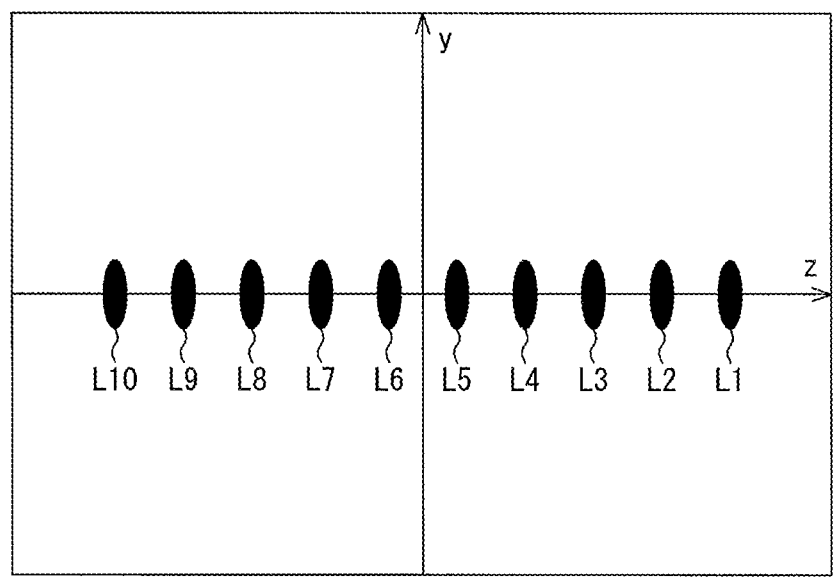

FIG. 11 is a view illustrating positions of output beams that serve as adjustment targets at the time when the adjustment method shown in FIG. 6 is carried out.

Figure 1:
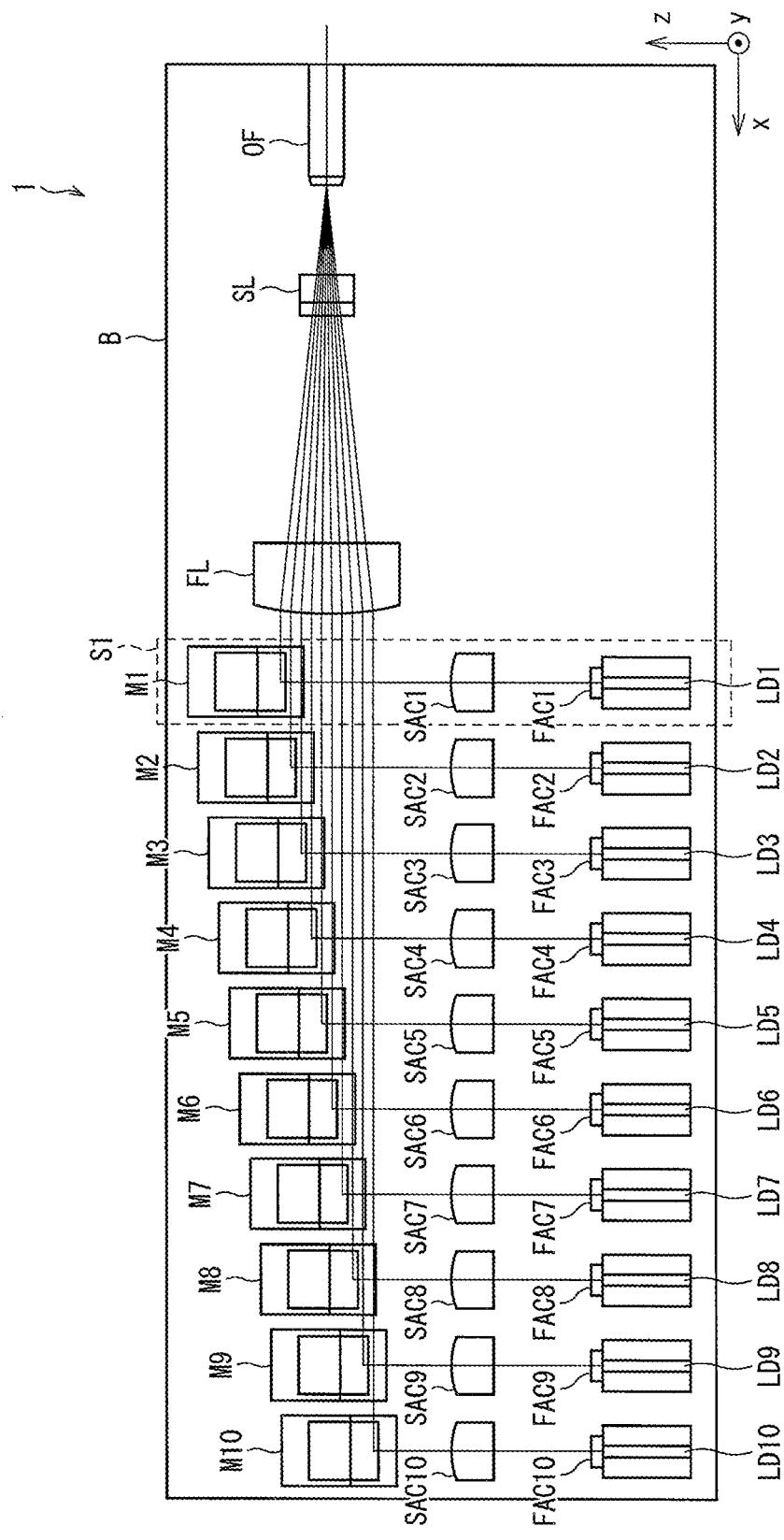
FIG. 1 is a top view illustrating a configuration of an LD module according to one embodiment of the present invention.
Figure 12:
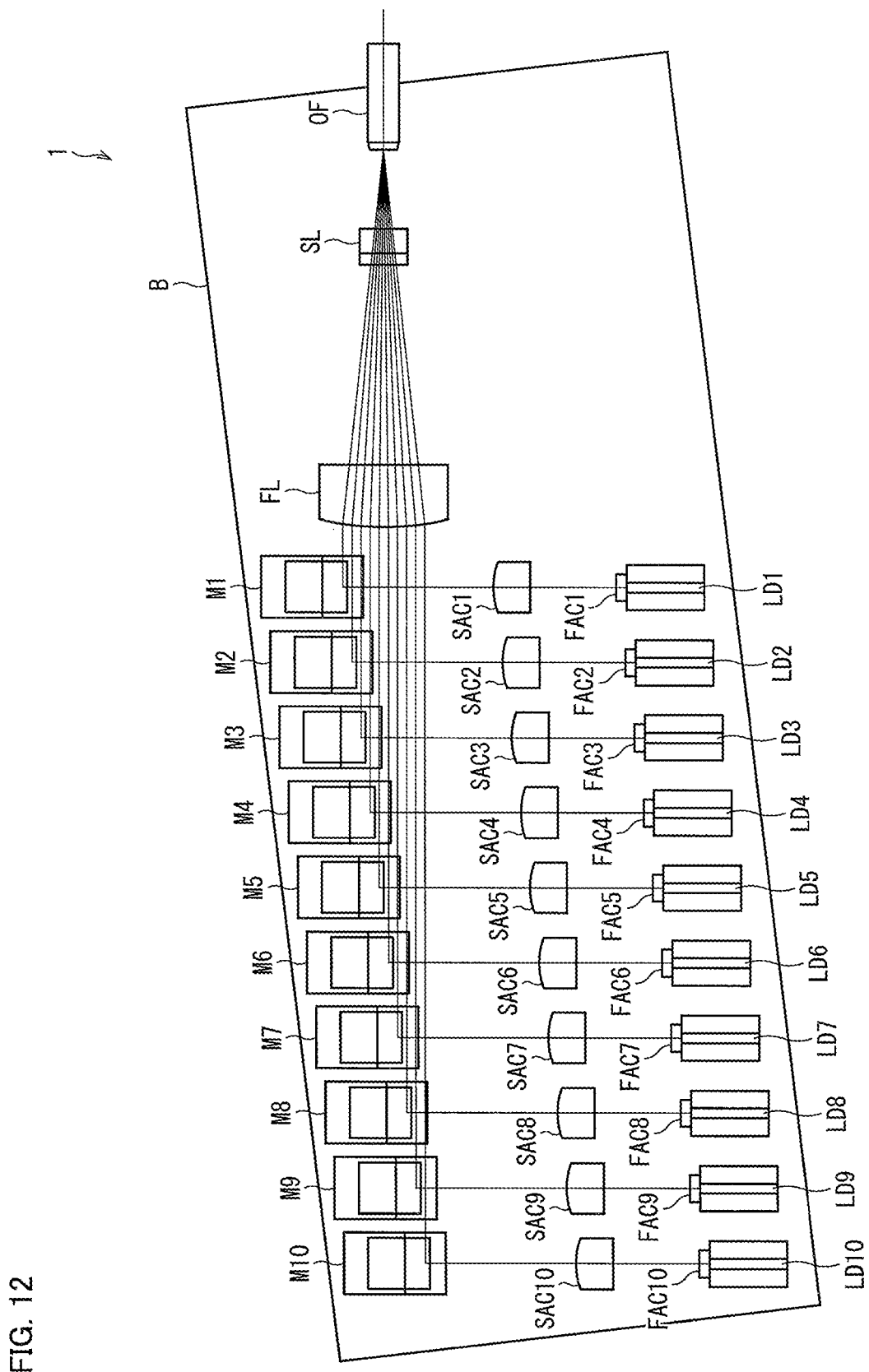

FIG. 12 is a top view illustrating a first modified example of the LD module illustrated in FIG. 1.

Figure 13:
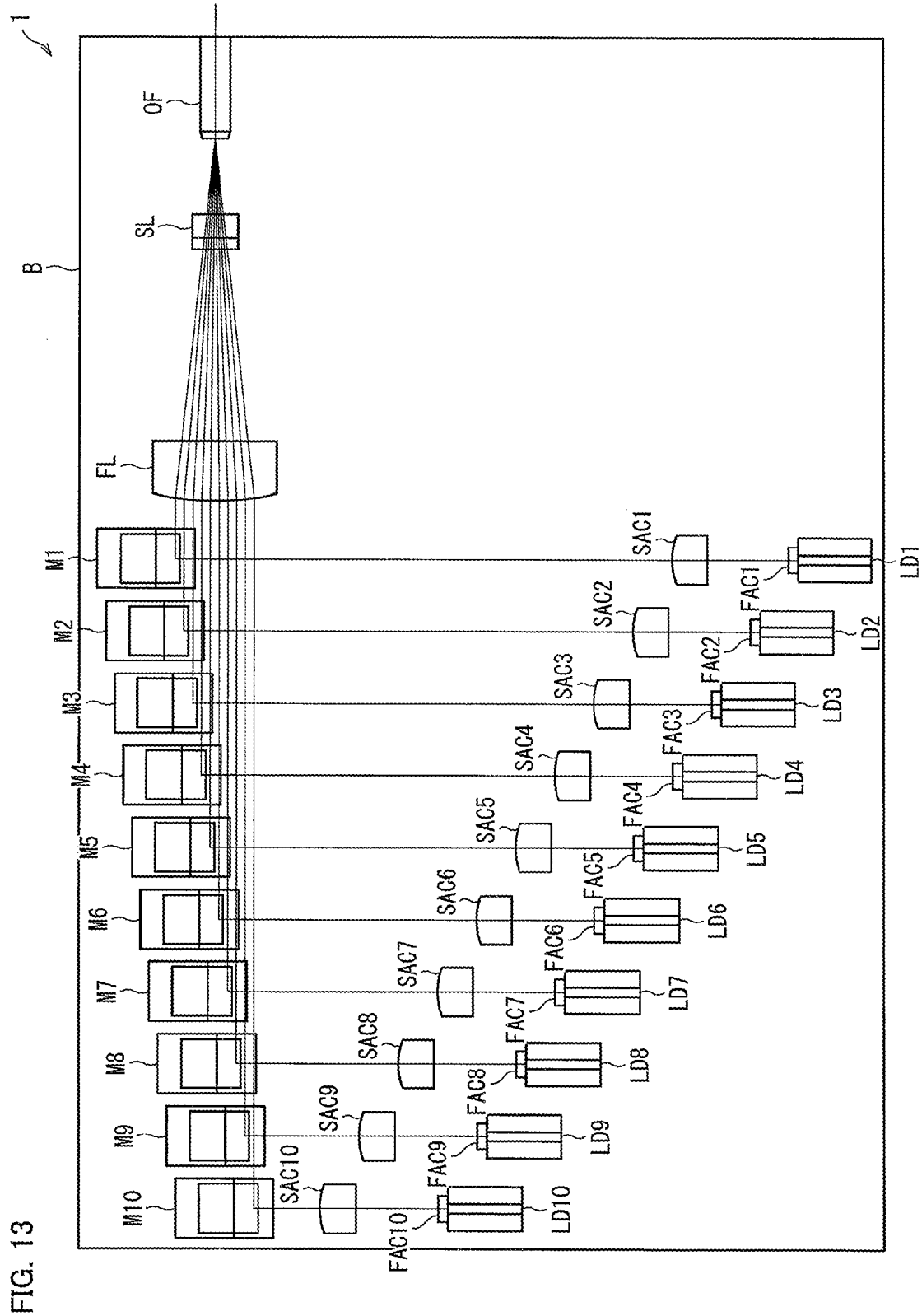

FIG. 13 is a top view illustrating a second modified example of the LD module illustrated in FIG. 1.

Figure 14:
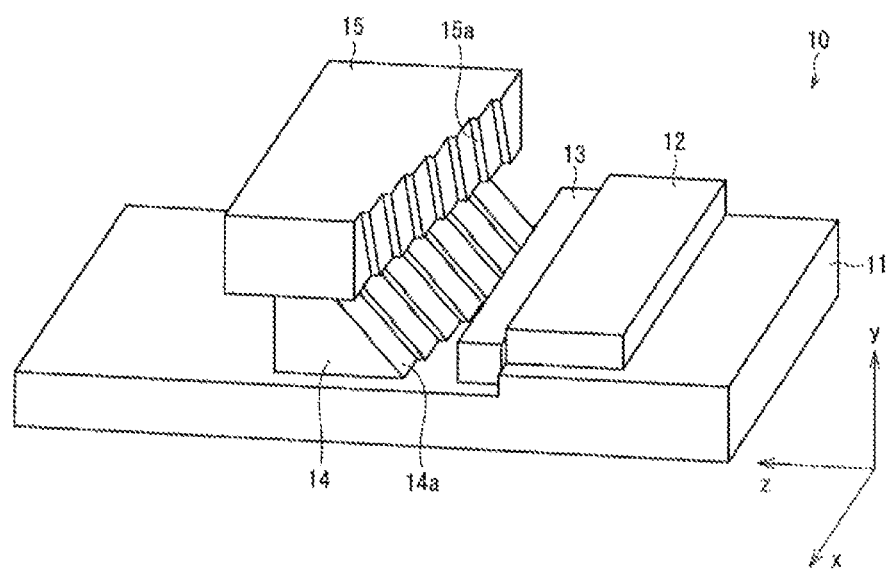

FIG. 14 is a perspective view illustrating a configuration of a conventional micro-optical device.

DESCRIPTION OF EMBODIMENTS

The following discusses an LD module according to one embodiment of the present invention, with reference to drawings.

[Configuration of LD Module]

The following discusses a configuration of an LD module 1 according to the present embodiment, with reference to FIG. 1. FIG. 1 is a top view illustrating the configuration of the LD module 1.

The LD module 1 is a module for coupling laser beams emitted from N LD chips LD1 to LD 10 (N=10 in the present embodiment) to an optical fiber OF. Note that in the present embodiment, the number N of the LD chips provided in the LD module 1 is 10, but in the present invention, the number is not limited to 10. In other words, the number N of LD chips provided in the LD module 1 can be any integer of two or more.

As illustrated in FIG. 1, the LD module 1 includes, in addition to the N LD chips LD1 to LD10, N F-axis collimating lenses FAC1 to FAC10, N S-axis collimating lenses SAC1 to SAC10, N double mirrors M1 to M10, a base plate B, an F-axis light collecting lens FL, and an S-axis light collecting lens SL. All of the LD chips LD1 to L10, the F-axis collimating lenses FAC1 to FAC10, the S-axis collimating lenses SAC1 to SAC10, the double mirrors M1 to M10, the F-axis light collecting lens FL, and the S-axis light collecting lens SL are mounted on the base plate B directly or via a mount (not illustrated).

In the LD module 1, the base plate B, the F-axis collimating lenses FAC1 to FAC10, the S-axis collimating lenses SAC1 to SAC10, and the double mirrors M1 to M10 constitute a light-guiding device corresponding to the conventional micro-optical device 10 (see FIG. 14). This light-guiding device, like the conventional micro-optical device 10, functions to convert an input beam bundle made of laser beams (hereinafter, also referred to as "input beams") that are emitted from the LD chips LD1 to LD10 and propagating in a z-axis positive direction, to an output beam bundle made of laser beams (hereinafter, also referred to as "output beams") that propagates in an x-axis negative direction.

In a light path of this output beam bundle, the F-axis light collecting lens FL and the S-axis light collecting lens SL are provided. The F-axis light collecting lens FL refracts the output beams constituting the output beam bundle so that intervals of the output beams become the smallest at an incident edge surface of the optical fiber OF (preferably, 0). Further, the S-axis light collecting lens SL converges the output beams constituting the output beam bundle so that a beam diameter in a y-axis direction becomes minimum (preferably, 0) at the incident edge surface of the optical fiber OF.

As illustrated in FIG. 1, the LD module 1 includes an optical system, as a unit, that includes an LD chip LDi, an F-axis collimating lens FACi, an S-axis collimating lens SACi, and a double mirror Mi. FIG. 1 illustrates, as an example, a unit optical system S1 which includes the LD chip LD1, the F-axis collimating lens FAC1, the S-axis collimating lens SAC1, and the double mirror M1.

[Configuration of Unit Optical System]

Figure 2:
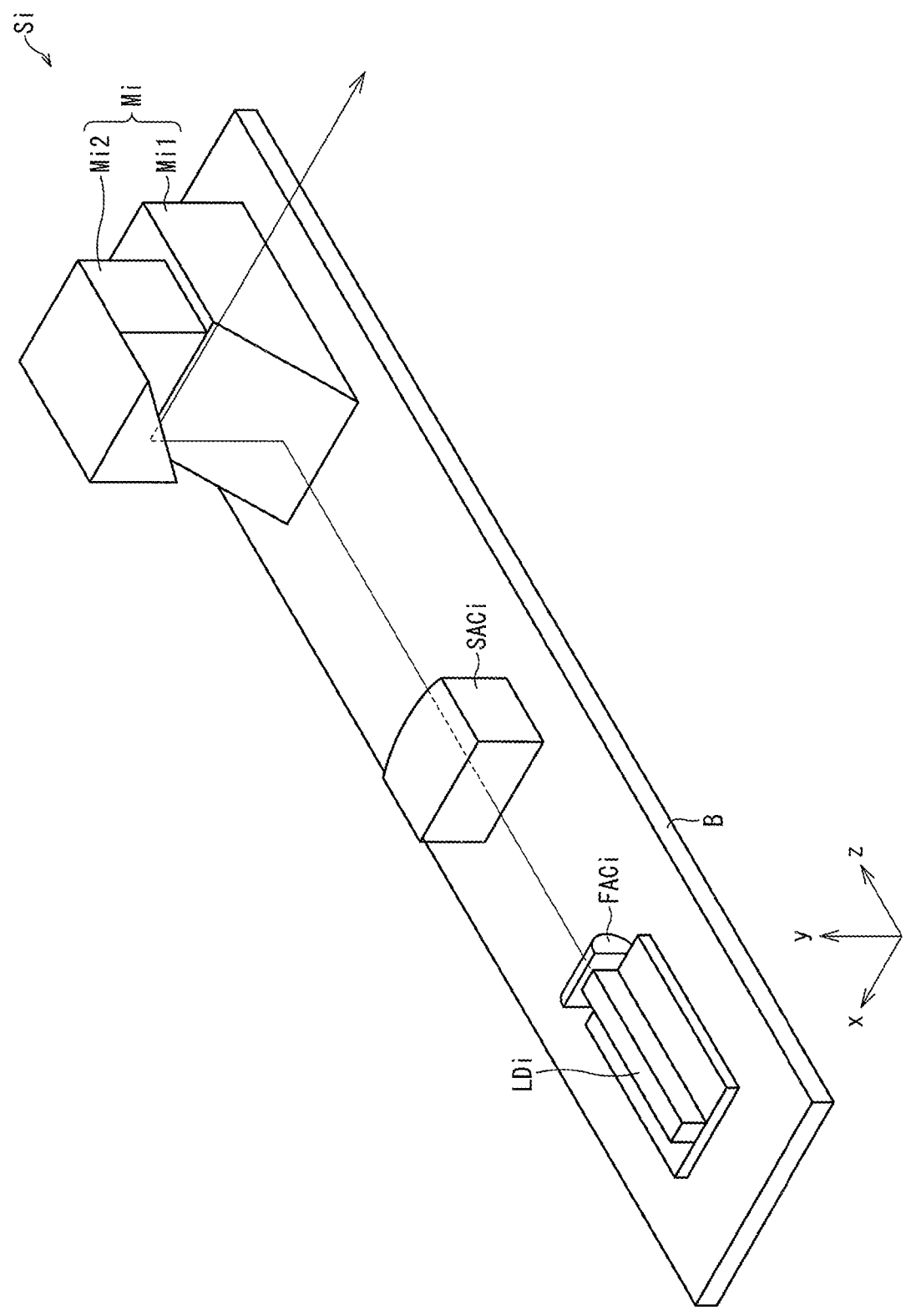
FIG. 2 is a perspective view illustrating a configuration of a unit optical system provided in the LD module illustrated in FIG. 1.

The following discusses a configuration of a unit optical system Si provided in the LD module 1, with reference to FIG. 2. FIG. 2 is a perspective view illustrating a configuration of the unit optical system Ui. As illustrated in FIG. 2, the unit optical system Ui includes an LD chip LDi, an F-axis collimating lens FACi, an S-axis collimating lens SACi, and a double mirror Mi.

The LD chip LDi is mounted on the base plate B so that an active layer becomes parallel to a zx plane and an emission edge surface faces in the z-axis positive direction. Accordingly, a laser beam emitted from this LD chip LDi has a propagation direction that is parallel to the z-axis positive direction, an F axis that is parallel to a y axis, and an S axis that is parallel to an x axis.

Note that the N LD chips LD1 to LD10 are aligned along the x axis, as illustrated in FIG. 1. Therefore, optical axes of the laser beams emitted in the z-axis positive direction from the LD chips LDi are aligned in parallel to one another along the x axis in a first plane that is parallel to the zx plane.

In a light path of the laser beam emitted from the LD chip LDi, the F-axis collimating lens FACi and the S-axis collimating lens SACi are provided. The F-axis collimating lens FACi is a lens for reducing, by collimation, a divergence of the laser beam emitted from the LD chip LDi in an F-axis direction. Meanwhile, the S-axis collimating lens SACi is a lens for reducing, by collimation, a divergence of the laser beam emitted from the LD chip LDi in an S-axis direction. The laser beam having transmitted the F-axis collimating lens FACi and the S-axis collimating lens SACi becomes a collimated beam whose propagation direction is converged in the z-axis positive direction. Note that in a case where the divergence of the laser beam emitted from the LD chip LDi in the S-axis direction is sufficiently small, the S-axis collimating lens SACi can be omitted.

In the light path of the laser beam emitted from the LD chip LDi, the double mirror Mi is further provided. The double mirror Mi is made of an i-th mirror Mi1 mounted on the base plate B and a second mirror Mi2 mounted on the first mirror Mi1. The first mirror Mi1 reflects the laser beam emitted from the LD chip LDi, and changes the propagation direction of the laser beam from the z-axis positive direction to a y-axis positive direction. The first mirror Mi1 is also called a "flip-up mirror". Further, the second mirror Mi1 reflects the laser beam that has been reflected by the first mirror Mi1 so that the propagation direction of the laser beam is changed from the y-axis positive direction to the x-axis negative direction. The second mirror Mi2 is also called a "folding mirror".

Note that as illustrated in FIG. 1, a double mirror Mi+1 that reflects a laser beam emitted from an (i+1)th LD element Di+1 (as counted in a direction from the x-axis negative side to the x-axis positive side) is provided on a z-axis negative direction side of a double mirror Mi that reflects a laser beam emitted from an i-th LD element Di (as counted in the direction from the x-axis positive side to the x-axis negative side). On this account, optical axes of the laser beams reflected by these double mirrors Mi are aligned along a z axis in a second plane that is parallel to the zx plane. This second plain is at a position that is on a y-axis positive direction side of the first plane as described above.

[Configuration of Double Mirror]

Figure 3:
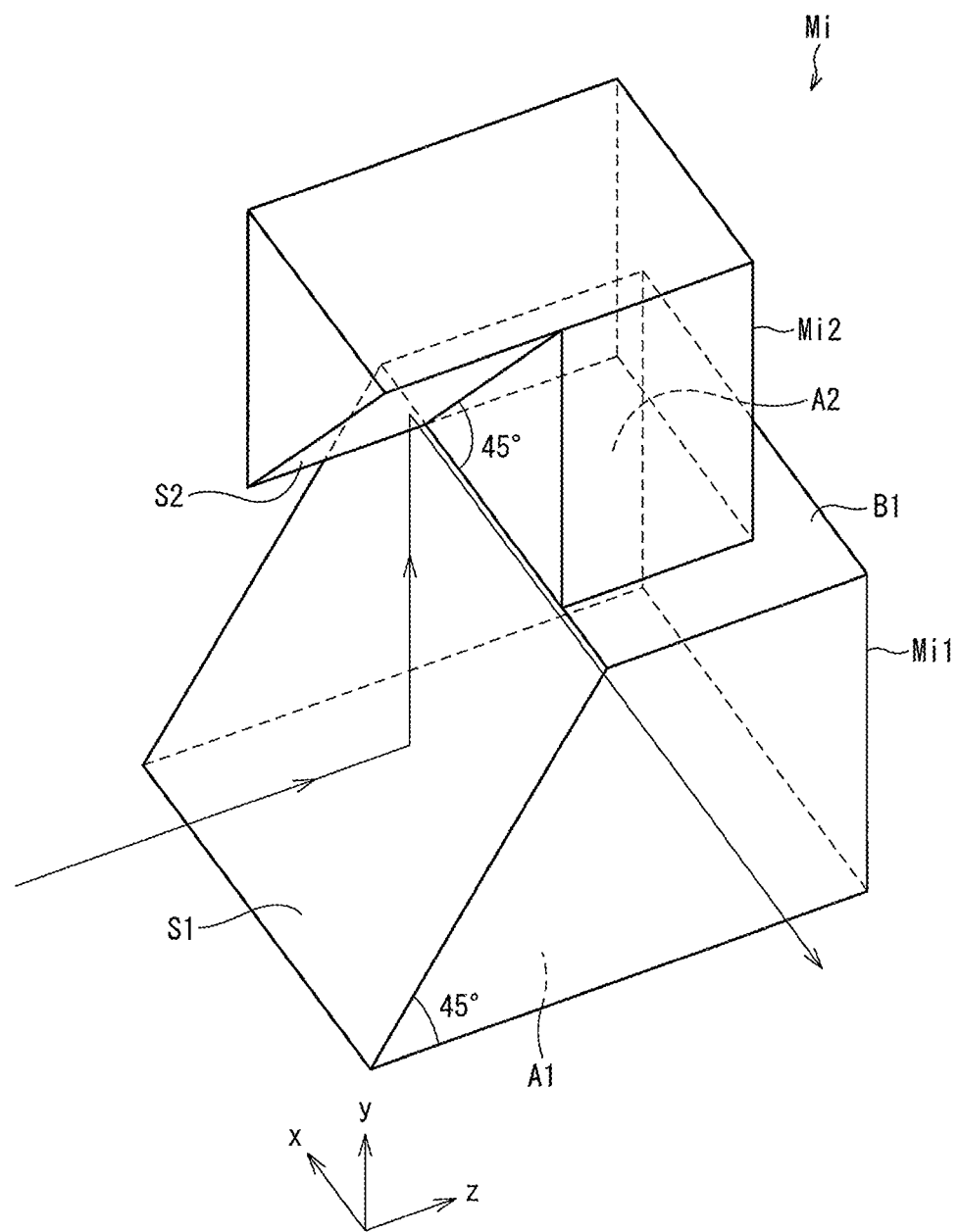
FIG. 3 is a perspective view illustrating a configuration of a double mirror provided in the LD module illustrated in FIG. 1.

The following discusses a configuration of the double mirror Mi provided in the LD module 1, with reference to FIG. 3. FIG. 3 is a perspective view illustrating the configuration of the double mirror Mi. As illustrated in FIG. 3, the double mirror Mi is made of a first mirror Mi1 and a second mirror Mi2.

The first mirror Mi1 is a polyhedral structure that has a bottom surface A1, a top surface B1 parallel to the bottom surface A1, and a reflective surface S1. The reflective surface S1 and the bottom surface A1 makes an angle of 45°, as illustrated in FIG. 3.

The first mirror Mi1 is mounted on the base plate B so that the bottom surface A1 abuts a top surface of the base plate B (see FIG. 2). As a result, a normal vector of the reflective surface S1 of the first mirror Mi1 (an outward normal vector pointing toward outside the first mirror Mi1 from the reflective surface S1) and a normal vector of the top surface (zx plane) of the base plate B (an outward normal vector pointing toward outside the base plate B from the top surface of the base plate B) makes an angle of 45°. Further, an orientation of the first mirror Mi1 is determined so that a normal of the reflective surface S1 becomes parallel to a yz plane. As a result, the reflective surface S1 of the first mirror Mi1 reflects an incident laser beam from the z-axis negative direction into the y-axis positive direction.

The second mirror Mi2 is a polyhedral structure that has at least a bottom surface A2 and a reflective surface S2. The reflective surface S2 and the bottom surface A2 makes an angle of 45° as illustrated in FIG. 3.

The second mirror Mi2 is mounted on the first mirror Mi1 so that the bottom surface A2 abuts the top surface B1 of the first mirror Mi1. As a result, a normal vector of the reflective surface S2 of the second mirror Mi2 (an outward normal vector pointing toward outside the second mirror Mi2 from the reflective surface S2) and the normal vector of the top surface (zx plane) of the base plate B (an outward normal vector pointing toward outside the base plate B from the top surface of the base plate B) makes an angle of 135°. Further, an orientation of the second mirror Mi2 is determined so that a normal of the reflective surface S2 becomes parallel to an xy plane. As a result, the reflective surface S2 of the second mirror Mi2 reflects an incident laser beam from a y-axis negative direction into the x-axis negative direction.

The LD module 1 allows a propagation direction of an output beam to coincide with the x-axis negative direction, by adjusting the orientations of the first mirror Mi1 and the second mirror Mi2 that constitute each double mirror Mi. This is because minute rotation of the first mirror Mi1 around the y axis as a rotation axis causes minute rotation of the propagation direction of the output beam and minute rotation of the second mirror Mi2 around the y axis as a rotation axis causes minute rotation of the propagation direction of the output beam.

Further, in the LD module 1, optical axes of output beams can be aligned at equal intervals within a plane parallel to the xz plane, by adjusting positions of the first mirror Mi1 and the second mirror Mi2 that constitute each double mirror Mi. This is for the following reason: when the first mirror Mi1 is translated in the z-axis positive direction or in the z-axis negative direction, the optical axes of the output beams are translated in the z-axis positive direction or in the z-axis negative direction; and when the second mirror Mi2 is translated in the x-axis positive direction or in the x-axis negative direction, the optical axes of the output beams are translated in the y-axis positive direction or in the y-axis negative direction.

Note that in the present embodiment, a first aim of such adjustment is to make propagation directions of the output beams constituting the output beam bundle coincide with the x-axis negative direction. However, the present invention is not limited to this. In other words, it is sufficient if it is possible to make the propagation directions of the output beams constituting the output beam coincide with a specific direction and this specific direction is not limited to the x-axis negative direction.

Further, in the present embodiment, a second aim of such adjustment is to align optical axes of the output beams constituting the output beam bundle at equal intervals in a plane parallel to the zx plane. However, the present invention is not limited to this. In other words, it is sufficient if it is possible to align the optical axes of the output beams constituting the output beam bundle at equal intervals in a specific plane and this specific plane is not limited to the plane parallel to the zx plane.

[Reason why Minute Rotation of Mirrors Causes Rotation of Output Beam]

Figure 4:
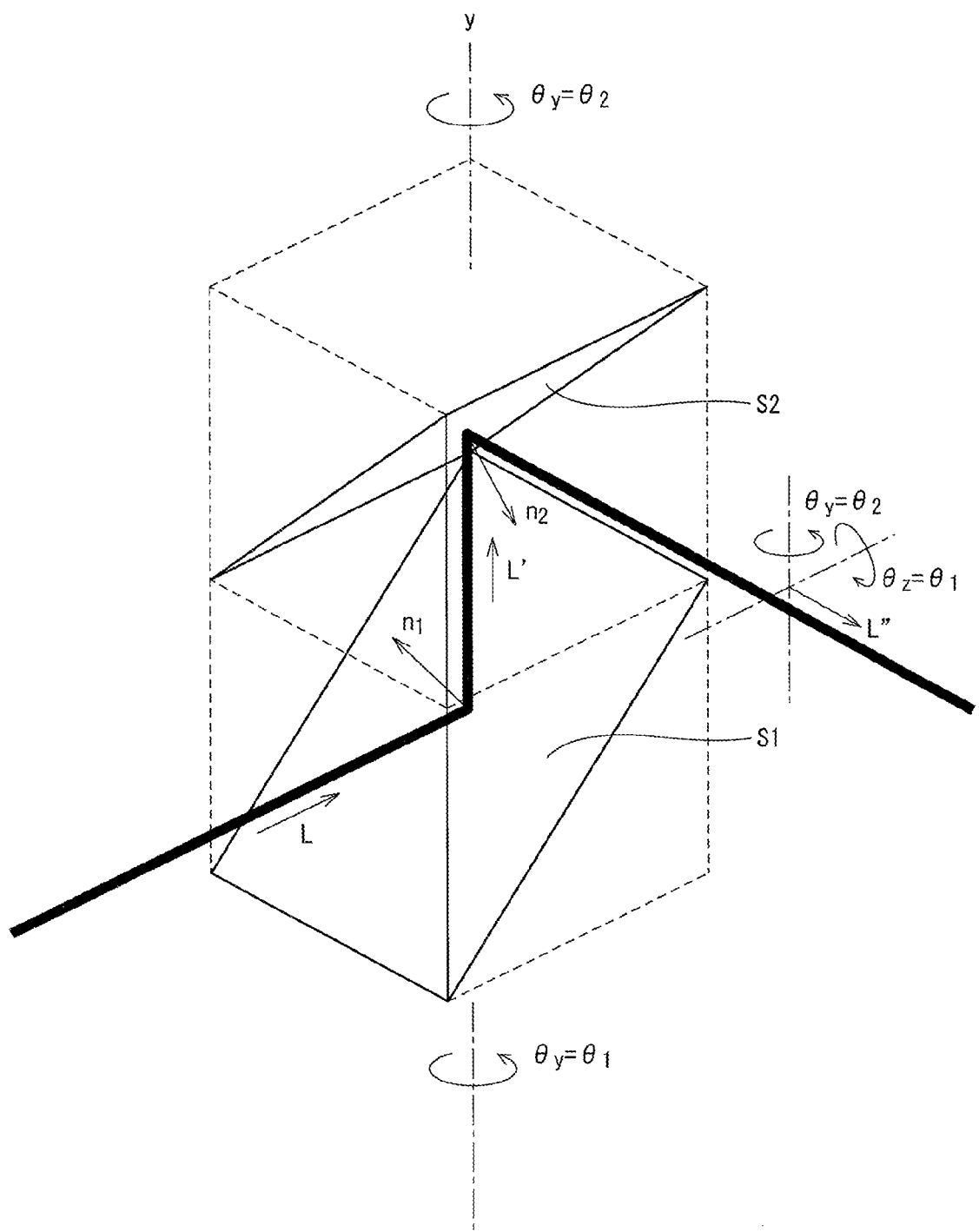
FIG. 4 is a view for illustrating that minute rotation of a first mirror and a second mirror provided in the double mirror illustrated in FIG. 3 causes minute rotation of a propagation direction of an output beam.

The following discusses a reason why minute rotation of the first mirror Mi1 and the second mirror Mi2 causes minute rotation of the output beam, with reference to FIG. 4.

On the assumption that a directional vector of an incident light (input beam) incident on the first reflective surface S1 is L, a directional vector L' of a reflected light outgoing from the first reflective surface S1 can be expressed as follows:

$$L'=L-2(L \cdot n1)n1 \quad (1)$$

where n1 is the normal vector of the first reflective surface S1 and (L·n1) is an inner product of the directional vector L and the normal vector n1.

Similarly, on the assumption that a directional vector of an incident light (input beam) incident on the second reflective surface S2 is L', a directional vector L" of a reflected light (output beam) outgoing from the second reflective surface S2 can be expressed as follows:

$$L''=L'-2(L' \cdot n2)n2 \quad (2)$$

where n2 is the normal vector of the second reflective surface S2 and (L'·n2) is an inner product of the directional vector L' and the normal vector n2.

Accordingly, when the directional vector of the incident light incident on the first reflective surface S1 is L, the directional vector L" of the reflected light outgoing from the second reflective surface S2 can be expressed as follows:

$$L''=L-2(L \cdot n1)n1-2\{(L \cdot n2)-2(L \cdot n1)(n1 \cdot n2)\}n2 \quad (3)$$

As for the normal vectors, when the first mirror Mi1 is rotated by θy=θ1 around the y axis as a rotation angle, the normal vector n1 of the first reflective surface S1 changes from $n1=(1/2)^{1/2}(0, 1, -1)$ to $n1=(1/2)^{1/2}(-\sin\theta1, 1, -\cos\theta1)$. Further, when the second mirror Mi2 is rotated by θy=θ2 around the y axis as a rotation axis, the normal vector n2 of the second reflective surface S2 changes from $n2=(1/2)^{1/2}(-1, -1, 0)$ to $n2=(1/2)^{1/2}(-\cos\theta2, -1, \sin\theta2)$.

In this case, respective components (L"x, L"y, L"z) of the directional vector L" of the reflected light outgoing from the second reflective surface S2 are given as follows according to the expression (3):

$$L''x = \sin 2\theta1 \cdot \cos \theta2 \cdot \sin \theta2 - \cos \theta1 \cdot \sin \theta1 \cdot \sin 2\theta2 - \cos \theta1 \cdot \cos \theta2 \quad (4)$$

$$L''y = \sin 2\theta1 \cdot \sin \theta2 + \cos \theta1 \cdot \sin \theta1 \cdot \cos \theta2 \quad (5)$$

$$L''z = \sin 2\theta1 \cdot \cos 2\theta2 + \cos \theta1 \cdot \sin \theta2(1-\sin \theta1 \cdot \cos \theta2) \quad (6)$$

In a case where θ1 and θ2 are sufficiently small, the following approximations are possible: $\sin \theta1 \approx \theta1$, $\cos \theta \approx 1$, $\sin \theta2 \approx \theta2$, and $\cos \theta2 \approx 1$. When these approximated values are substituted into the expressions (4) to (6), the following expression that approximates the directional vector L" of the reflected light outgoing from the second reflective surface S2 can be obtained in disregard of minute amounts ($\theta1^2$, $\theta2^2$, θ1×θ2, etc.) of second or higher degree.

$$L'' \approx (-1, \theta1, \theta2) \quad (7)$$

The following is clear from this expression (7). That is, when the first mirror Mi1 is minutely rotated by θy=θ1 around the y axis as a rotation axis, the directional vector L" of the reflected light outgoing from the second reflective surface S2 minutely rotates by θz=θ1 around the z axis as a rotation axis, as illustrated in FIG. 4. Meanwhile, when the second mirror Mi2 is minutely rotated by θy=θ2 around the y axis as a rotation axis, the directional vector L" of the reflected light outgoing from the second reflective surface S2 minutely rotates by θy=θ2 around the y axis as a rotation axis, as illustrated in FIG. 4.

[Method of Adjusting Orientations and Positions of Mirrors]

Figure 5:
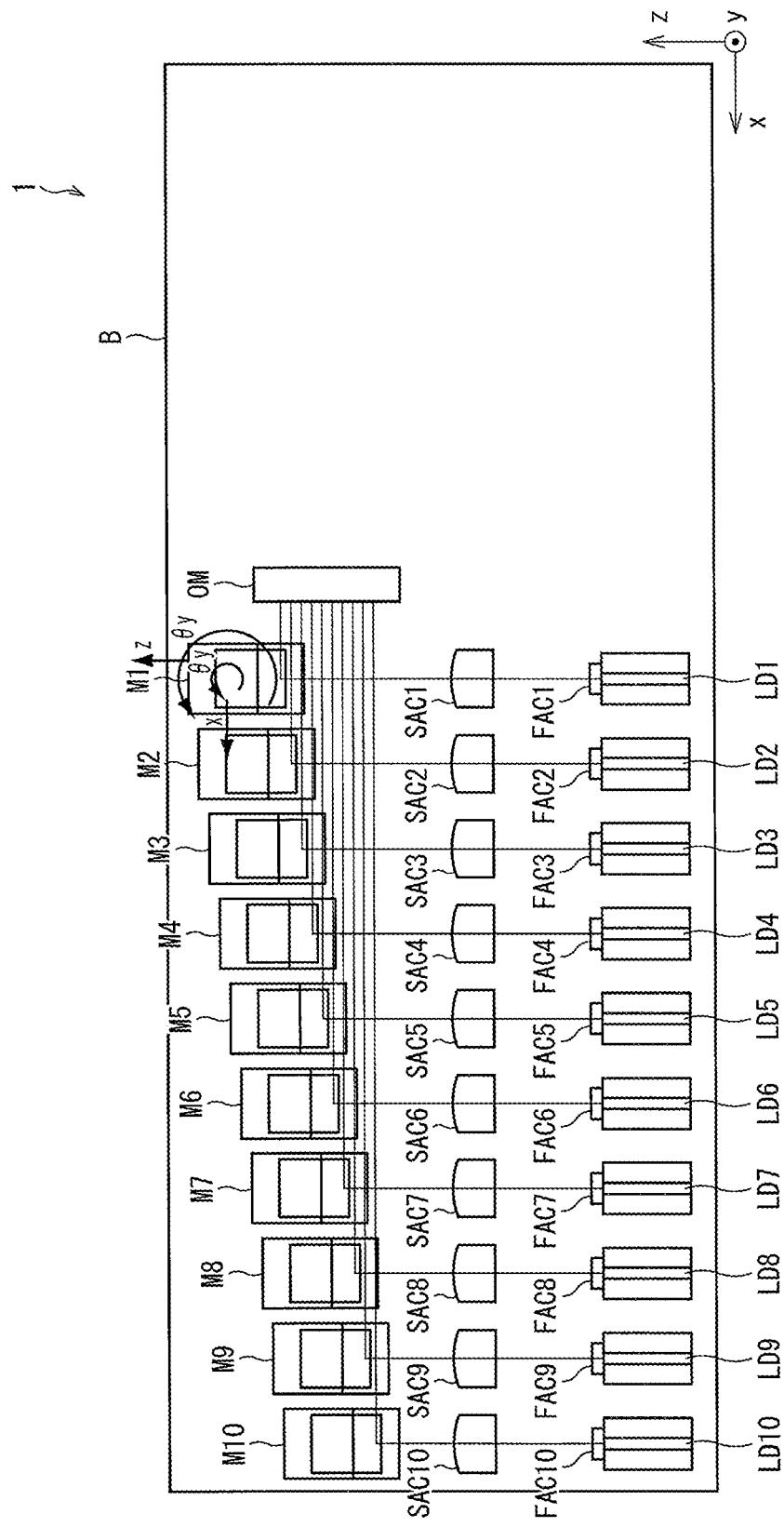
FIG. 5 is a top view illustrating a configuration of an LD module in a case where an adjustment method shown in FIG. 6 is carried out.

The following discusses a method of adjusting an orientation and a position of each of the first mirror Mi1 and the second mirror Mi2, with reference to FIGS. 5 to 11. FIG. 5 is a top view illustrating a configuration of the LD module 1 in a case where this adjustment method is carried out. FIG. 6 is a flow chart illustrating a flow of the adjustment method. FIGS. 7 to 10 are views illustrating, respectively, steps of the adjustment method. FIG. 11 is a view illustrating positions of output beams that serve as adjustment targets in the adjustment method.

The present adjustment method is carried out by use of an optical monitor device OM, as illustrated in FIG. 5. The optical monitor device OM is a device for detecting orientations and positions of incident laser beams. This optical monitor device OM is provided in the light path of the output beam bundle at the time when the present adjustment method is carried out. Further, the present adjustment method is carried out in a state where the bottom surface of the first mirror Mi1, to which bottom surface an adhesive is applied, is mounted on the base plate B, and the bottom surface of the second mirror Mi2, to which bottom surface an adhesive is applied, is mounted on the first mirror Mi1. These adhesives are cured by UV light or the like after the present adjustment method is carried out.

As illustrated in FIG. 6, the present adjustment method is carried out by repeating for each double mirror Mi a first-mirror rotating step T1, a second-mirror rotating step T2, a first-mirror sliding step T3, and a second-mirror sliding step T4.

The first-mirror rotating step T1 is a step in which a propagation direction of an output beam is minutely rotated around the z axis as a rotation axis by causing minute rotation of the first mirror Mi1 around the y axis as a rotation axis. More specifically, in this step T1, the first mirror Mi1 is minutely rotated (rotation around the y axis as a rotation axis) by use of a rotation stage so that an inclination (an inclination caused by the rotation around the z axis as a rotation axis) of the output beam which inclination is detected by the optical monitor device OM becomes the smallest (preferably, 0).

(a) of FIG. 7 is a top view (upper part) and a front view (lower part) each illustrating, as an example, a state of the double mirror Mi prior to the first-mirror rotating step T1. (b) of FIG. 7 is a top view (upper part) and a front view (lower part) each illustrating, as an example, a state of the double mirror Mi after the first-mirror rotating step T1. As illustrated in the lower part of (a) of FIG. 7, in a case where the propagation direction of the output beam has been minutely rotated by Δθz from an x-axis direction around the z axis as a rotation axis, the first mirror Mi1 is minutely rotated around the y axis as a rotation axis as illustrated in the upper part of (a) of FIG. 7. This makes the propagation direction of the output beam coincide with the x-axis negative direction as illustrated in the lower part of (b) of FIG. 7.

The second-mirror rotating step T2 is a step in which the propagation direction of the output beam is minutely rotated around the y axis as a rotation axis by causing minute rotation of the second mirror Mi2 around the y axis as a rotation axis. More specifically, in this step T2, the first mirror Mi2 is minutely rotated (rotation around the y axis as a rotation axis) by use of a rotation stage so that an inclination (an inclination caused by the rotation around the y axis as a rotation axis) of the output beam which inclination is detected by the optical monitor device OM becomes the smallest (preferably, 0).

(a) of FIG. 8 is a top view (upper part) and a side view (lower part) each illustrating, as an example, a state of the double mirror Mi prior to the second-mirror rotating step T2. (b) of FIG. 8 is a top view (upper part) and a side view (lower part) each illustrating, as an example, a state of the double mirror Mi after the second-mirror rotating step T2. As illustrated in the upper part of (a) of FIG. 8, in a case where the propagation direction of the output beam has been minutely rotated by Δθy from the x-axis direction around the y axis as a rotation axis, the second mirror Mi2 is minutely rotated around the y axis as a rotation axis, as illustrated in the upper part of (a) of FIG. 8. This makes the propagation direction of the output beam coincide with the x-axis negative direction, as illustrated in the upper part of (b) of FIG. 8.

The first aim of the adjustment is to make propagation directions of respective output beams constituting an output beam bundle coincide with the x-axis negative direction, and this first aim of the adjustment can be achieved by carrying out the first-mirror rotating step T1 and the second-mirror rotating step T2.

The first-mirror sliding step T3 is a step in which an optical axis of the output beam is translated in parallel to the z axis, by translating the first mirror Mi1 in parallel to the z axis. More specifically, this step T3 is a step in which the first mirror Mi1 is translated in parallel to the z axis by use of a position controlling stage so that a z-coordinate of the output beam which is detected by the optical monitor device OM becomes a predetermined adjustment target value.

(a) of FIG. 9 is a side view illustrating, as an example, a state of the double mirror Mi prior to the first-mirror sliding step T3. (b) of FIG. 9 is a side view illustrating, as an example, a state of the double mirror Mi after the first-mirror sliding step T3. As illustrated in (a) of FIG. 9, in a case where the optical axis of the output beam has been shifted by Az in the z-axis positive direction, the first mirror Mi1 is translated in the z-axis negative direction. This eliminates such a shift of the optical axis of the output beam in the z-axis direction, as illustrated in (b) of FIG. 9.

The second-mirror sliding step T4 is a step in which the optical axis of the output beam is translated in parallel to the y axis, by translating the second mirror Mi2 in parallel to the x axis. More specifically, this step T4 is a step in which the second mirror Mi2 is translated in parallel to the x axis by use of a position controlling stage so that a y-coordinate of the output beam detected by the optical monitor device OM becomes a predetermined adjustment target value.

(a) of FIG. 10 is a front view illustrating, as an example, a state of the double mirror Mi prior to the second-mirror sliding step T4. (b) of FIG. 10 is a front view illustrating, as an example, a state of the double mirror Mi after the second-mirror sliding step T4. As illustrated in (a) of FIG. 10, in a case where an optical axis of an output beam has been shifted by Δy in the y-axis positive direction, the second mirror Mi2 is translated in the x-axis positive direction. This eliminates such a shift of the optical axis of the output beam in the y-axis direction, as illustrated in (b) of FIG. 10.

The second aim of the adjustment is to align optical axes of the respective output beams constituting the output beam bundle at equal intervals in a plane that is parallel to the zx plane, and this second aim of the adjustment can be achieved by carrying out the first-mirror sliding step T3 and the second-mirror sliding step T4.

In a case where the second aim of the adjustment is to align the optical axes of the respective output beams constituting the output beam bundle within a plane that is parallel to the zx plane, the adjustment target values that are to be referred to in the first-mirror sliding step T3 and the second-mirror sliding step T4 should be determined as illustrated in FIG. 11. That is, the adjustment target values should be determined so that beam spots Li of the respective output beams are aligned at equal intervals on the z axis on a light-receiving surface of the optical monitor device OM.

Note that, as illustrated in FIG. 6, the first-mirror sliding step T3 and the second-mirror sliding step T4 are preferably carried out after the propagation directions of the respective output beams constituting the output beam bundle are made parallel to one another by carrying out the first-mirror rotating step T1 and the second-mirror rotating step T2. However, the order in which the first-mirror rotating step T1 and the second-mirror rotating step T2 are carried out and the order in which the first-mirror sliding step T3 and the second-mirror sliding step T4 are carried out are not limited to those shown in FIG. 6. In other words, it is possible to employ a configuration in which the first-mirror rotating step T1 is carried out after the second-mirror rotating step T2 is carried out and/or a configuration in which the first-mirror sliding step T3 is carried out after the second-mirror sliding step T4 is carried out.

Further, in a case where an adhesive is used for fixing the first mirror Mi1 to the base plate B and for fixing the second mirror Mi2 to the first mirror Mi1, it is preferable to fix the first mirror Mi1 and the second mirror Mi2 as follows. That is, after the adhesive is applied between the bottom surface of the first mirror Mi1 and the top surface of the base plate B and between the bottom surface of the second mirror Mi2 and the top surface of the first mirror Mi1, the first-mirror rotating step T1, the second-mirror rotating step T2, the first-mirror sliding step T3, and the second-mirror sliding step T4 are carried out. Note, however, that in a period in which these steps T1 to T4 are carried out and in a period from the end of these steps through the completion of curing of the adhesive, the top surface and the bottom surface of the first mirror Mi1, the top surface of the base plate B, and the bottom surface of the second mirror Mi2 are kept in a state in which the bottom surface of the first mirror Mi1 and the top surface of the base plate B are parallel to each other and the bottom surface of the second mirror Mi2 and the top surface of the first mirror Mi1 are parallel to each other. This makes it possible to uniformize a thickness of an adhesive layer formed between the bottom surface of the first mirror Mi1 and the top surface of the base plate B and a thickness of an adhesive layer formed between the bottom surface of the second mirror Mi2 and the top surface of the first mirror Mi1.

If the thickness of the adhesive layer formed between the top surface of the base plate B and the bottom surface of the first mirror Mi1 is uniform, an amount of expansion or shrinkage becomes equal at any position even in a case where the adhesive layer expands or shrinks. Accordingly, even in a case where the adhesive layer expands or shrinks, only parallel shift of the first mirror Mi1 occurs in a direction that is orthogonal to the top surface of the base plate B (a thickness direction of the adhesive layer), and the top surface of the base plate B and the bottom surface of the first mirror Mi1 stay parallel to each other. Similarly, if the thickness of the adhesive layer formed between the top surface of the first mirror Mi1 and the bottom surface of the second mirror Mi2 is uniform, only parallel shift of the second mirror Mi2 occurs in a direction that is orthogonal to the top surface of the first mirror Mi1, and the top surface of the first mirror Mi1 and the bottom surface of the second mirror Mi2 stay parallel to each other even in a case where the adhesive layer expands or shrinks. Accordingly, if the thickness of each of these adhesive layers is uniform, it is possible to avoid the occurrence of, for example, a case where a propagation direction of an output beam inclines or a case where alignment of the optical axes of the output beams is lost even in a case where the adhesive layers shrink or expand. Note that possible shrinkage or expansion of these adhesive layers are cure shrinkage that may occur when the adhesive is cured, a thermal expansion that may occur after the adhesive is cured, a thermal shrinkage, swelling, or the like.

Furthermore, preferably, each of the thickness of the adhesive layer formed between the top surface of the base plate B and the bottom surface of the first mirror Mi1 and the thickness of the adhesive layer formed between the top surface of the first mirror Mi1 and the bottom surface of the second mirror Mi2 is made as small as possible in a range that can ensure a required adhesive force. A smaller thickness of each of these adhesive layers results in a smaller amount of change in thickness that occurs in a case where each of these adhesive layers expands or shrinks. This consequently makes it easily to keep the top surface of the base plate B and the bottom surface of the first mirror Mi1 parallel to each other and also keep the top surface of the first mirror Mi1 and the bottom surface of the second mirror Mi2 parallel to each other. Particularly, it is preferable that each of (a) the thickness of the adhesive layer formed between the top surface of the base plate B and the bottom surface of the first mirror Mi1 and (b) the thickness of the adhesive layer formed between the top surface of the first mirror Mi1 and the bottom surface of the second mirror Mi2 be smaller than a tolerance of the base plate B (more specifically, a tolerance of a thickness of the base plate B) and also be smaller than a dimensional tolerance of the double mirror Mi (more specifically, a tolerance of a thickness of the first mirror Mi1 or a thickness of the second mirror). In this case, an amount of change in thickness that occurs in a case where each of the adhesive layers expands or shrinks becomes also smaller than each of the dimensional tolerance of the double mirror Mi and the dimensional tolerance of the base plate B (in general, the amount of change in thickness of each of the adhesive layers is smaller than the thickness of each of the adhesive layers). Therefore, even in a case where these adhesive layers expand or shrink, a degree of parallelism of the top surface of the base plate B and the bottom surface of the first mirror Mi1 and a degree of parallelism of the top surface of the first mirror Mi1 and the bottom surface of the second mirror Mi2 never become lower than a degree accepted in designing regardless of whether or not the thicknesses of the adhesive layers are uniform.

[Modified Examples]

Note that although the present embodiment has discussed a configuration where the LD chips LD1 to LD10 are provided along the x axis, the present invention is not limited to this configuration.

For example, as illustrated in FIG. 12, the LD chips LD1 to LD10 each may be provided obliquely in a manner such that a light path length from an LD chip LDi to a double mirror Mi becomes constant. In this case, it is possible to reduce a size of the base plate B as illustrated in FIG. 12.

Alternatively, as illustrated in FIG. 13, the LD chips LD1 to LD10 may be provided along an oblique line in a manner such that a light path length from an LD chip LDi to the F-axis light collecting lens FL becomes constant. In this case, beam radii of the laser beams incident on the F-axis light collecting lens L become the same. Accordingly, the output beam bundle can be converged more precisely.

[Conclusion]

As described above, a light-guiding device according to the present embodiment that converts an input beam bundle made of a plurality of input beams to an output beam bundle made of a plurality of output beams, includes: double mirrors each corresponding to a corresponding one of the input beams, the double mirrors each being separated from the other double mirrors each corresponding to another one of the input beams, the double mirrors respectively corresponding to the input beams each being made of a first mirror that is mounted on a specific flat surface and a second mirror that is mounted on the first mirror, the first mirror having a first reflective surface whose normal makes an angle of 45° with a normal of the specific flat surface, the first reflective surface reflecting a corresponding one of the input beams, the second mirror having a second reflective surface whose normal makes an angle of 135° with the normal of the specific flat surface, the second reflective surface reflecting the corresponding one input beam that has been reflected by the first reflective surface.

In the above configuration, the first reflective surface for reflecting a corresponding one of the input beams is provided to the first mirror mounted on the specific flat surface. Further, the second reflective surface for reflecting the input beam reflected by the first reflective surface is provided to the second mirror mounted on the first mirror. Accordingly, a propagation direction of each of the output beams can be freely adjusted by rotating each of the first mirror and the second mirror. For example, even in a case where a propagation direction of an input beam is inclined, a propagation direction of a corresponding output beam can be adjusted into a predetermined direction. Furthermore, a position of an optical axis of each of the output beams can also be freely adjusted by sliding each of the first mirror and the second mirror.

Moreover, in the above configuration, the double mirrors each correspond to a corresponding one of the input beams. Further, each of these double mirrors is separated from the other double mirrors each corresponding to another one of the input beams. Accordingly, a propagation direction of each of the output beams can be adjusted independently from propagation directions of the other output beams. This makes it possible to adjust the propagation directions of the output beams into a predetermined direction even in a case where the propagation directions of the input beams vary. In addition, it also becomes possible to adjust a position of an optical axis of each of the output beams independently from positions of optical axes of the other output beams.

In the light-guiding device according to the present embodiment, preferably, in each one of the double mirrors respectively corresponding to the input beams, respective orientations of the first mirror and the second mirror are adjusted so that propagation directions of the output beams constituting the output beam bundle coincide with a specific direction.

The above configuration makes it possible to obtain an output beam bundle that can be converged precisely through a convex lens or the like.

In the light-guiding device according to the present embodiment, preferably, in each one of the double mirrors respectively corresponding to the input beams, respective positions of the first mirror and the second mirror are adjusted so that optical axes of the output beams constituting the output beam bundle are aligned at equal intervals within a specific plane.

The above configuration makes it possible to obtain an output beam bundle that can be converged more precisely.

The scope of the present embodiment encompasses a method for producing the light-guiding device.

Further, it becomes possible to produce a light-guiding device generating an output beam bundle that can be converged precisely, by further including the step of adjusting respective orientations of the first mirror and the second mirror of each one of the double mirrors so that propagation directions of the output beams constituting the output beam bundle coincide with a specific direction, the each one double mirror corresponding to a corresponding one of the input beams, or by further including the step of adjusting respective positions of the first mirror and the second mirror of each one of the double mirrors so that respective optical axes of the output beams are aligned at equal intervals within a specific plane, the each one double mirror corresponding to a corresponding one of the input beams in addition to the step of adjusting respective orientations of the first mirror and the second mirror.

The scope of the present embodiment also encompasses an LD module including the light-guiding device.

By including the light-guiding device, it becomes possible to provide an LD module capable of realizing a higher output and a higher efficiency.

[Additional Matters]

The present invention is not limited to the description of the embodiments above, but may be altered as appropriate by a skilled person within the scope of the claims. That is, the present invention encompasses an embodiment based on a proper combination of technical means modified as appropriate within the scope of the claims.

Industrial Applicability

The present invention can be suitably applied to an LD module, and in particular, to an LD module that has an LD chip(s) as a light source.

REFERENCE SIGNS LIST

1 LD module
LD1 to LD10 LD chip
FAC1 to FAC10 F-axis collimating lens
SAC1 to SAC10 S-axis collimating lens
M1 to M10 double mirror
Mi1 first mirror
S1 reflective surface (first reflective surface)
Mi2 second mirror
S2 reflective surface (second reflective surface)
B base plate
FL F-axis light collecting lens
SL S-axis light collecting lens

The invention claimed is:

1. A light-guiding device that converts an input beam bundle made of a plurality of input beams to an output beam bundle made of a plurality of output beams, comprising:
double mirrors each corresponding to a corresponding one of the input beams, the double mirrors each being separated noncontiguously from the other double mirrors each corresponding to another one of the input beams such that the double mirrors are capable of individually being adjusted with respect to physical orientation thereof,
the double mirrors respectively corresponding to the input beams each being made of a first mirror that is mounted on a specific flat surface and a second mirror that is mounted on the first mirror,
the first mirror having a first reflective surface whose normal vector makes an angle of 45° with a normal vector of the specific flat surface, the first reflective surface reflecting a corresponding one of the input beams,
the second mirror having a second reflective surface whose normal vector makes an angle of 135° with the normal vector of the specific flat surface, the second reflective surface reflecting the corresponding one input beam that has been reflected by the first reflective surface.

2. The light-guiding device as set forth in claim 1, wherein:
in each one of the double mirrors respectively corresponding to the input beams, respective orientations of the first mirror and the second mirror are adjusted so that propagation directions of the output beams constituting the output beam bundle coincide with a specific direction.

3. The light-guiding device as set forth in claim 2, wherein:
in each one of the double mirrors respectively corresponding to the input beams, respective positions of the first mirror and the second mirror are adjusted so that optical axes of the output beams constituting the output beam bundle are aligned at equal intervals within a specific plane.

4. The light-guiding device as set forth in claim 1, wherein:
the specific flat surface and a bottom surface of the first mirror are adhered to each other via an adhesive layer formed between the specific flat surface and the bottom surface, the adhesive layer having a uniform thickness; and
a top surface of the first mirror and a bottom surface of the second mirror are adhered to each other via an adhesive layer formed between the top surface of the first mirror and the bottom surface of the second mirror, the adhesive layer having a uniform thickness.

5. The light-guiding device as set forth in claim 4, wherein:
a thickness of an adhesive layer formed between the specific flat surface and a bottom surface of the first mirror and a thickness of an adhesive layer formed between a top surface of the first mirror and a bottom surface of the second mirror each are smaller than a dimensional tolerance of the double mirror.

6. A method for producing a light-guiding device that converts an input beam bundle made of a plurality of input beams to an output beam bundle made of a plurality of output beams, wherein the light-guiding device comprises:
double mirrors each corresponding to a corresponding one of the input beams, the double mirrors each being separated noncontiguously from the other double mirrors each corresponding to another one of the input beams,
the double mirrors respectively corresponding to the input beams each being made of a first mirror that is mounted on a specific flat surface and a second mirror that is mounted on the first mirror,
the first mirror having a first reflective surface whose normal vector makes an angle of 45° with a normal vector of the specific flat surface, the first reflective surface reflecting a corresponding one of the input beams,
the second mirror having a second reflective surface whose normal vector makes an angle of 135° with the normal vector of the specific flat surface, the second reflective surface reflecting the corresponding one input beam that has been reflected by the first reflective surface,
the method comprising the step of:
adjusting physical orientations of the double mirrors individually by adjusting respective orientations of the first mirror and the second mirror of each one of the double mirrors so that propagation directions of the output beams constituting the output beam bundle coincide with a specific direction, the each one double mirror corresponding to a corresponding one of the input beams.

7. The method as set forth in claim 6, further comprising the step of:
adjusting respective positions of the first mirror and the second mirror of each one of the double mirrors so that respective optical axes of the output beams are aligned at equal intervals within a specific plane, the each one double mirror corresponding to a corresponding one of the input beams.

8. An LD module comprising:
a plurality of LD elements; and
a light-guiding device that converts an input beam bundle made of a plurality of laser beams that have respectively been emitted from the plurality of LD elements, to an output beam bundle made of a plurality of output beams,
the light guiding device including double mirrors each corresponding to a corresponding one of the LD elements, the double mirrors each being separated noncontiguously from the other double mirrors each corresponding to another one of the LD elements such that the double mirrors are capable of individually being adjusted with respect to physical orientation thereof,
the double mirrors respectively corresponding to the LD elements each being made of a first mirror that is mounted on a specific flat surface and a second mirror that is mounted on the first mirror,
the first mirror having a first reflective surface whose normal vector makes an angle of 45° with a normal vector of the specific flat surface, the first reflective surface reflecting a corresponding one of the laser beams, the corresponding one laser beam being emitted from a corresponding one LD element,
the second mirror having a second reflective surface whose normal vector makes an angle of 135° with the normal vector of the specific flat surface, the second reflective surface reflecting the corresponding one laser beam that has been reflected by the first reflective surface.

9. The LD module as set form in claim 8, further comprising:
   a converging lens that converges the output beam bundle on an incident edge surface of an optical fiber,
   wherein in each one of the double mirrors respectively corresponding to the LDs, respective orientations of the first mirror and the second mirror are adjusted so that propagation directions of the output beams constituting the output beam bundle coincide with a specific direction,
   wherein in each one of the double mirrors respectively corresponding to the LDs, respective positions of the first mirror and the second mirror are adjusted so that optical axes of the output beams constituting the output beam bundle are aligned at equal intervals within a specific plane.

10. The light-guiding device as set forth in claim 1, wherein:
   the first reflective surface reflects, to the outside of the first mirror, a corresponding one of the input beams that are incident on the first mirror from the outside of the first mirror; and
   the second reflective surface reflects, to the outside of the second mirror, the corresponding one input beam that is incident on the second mirror form the outside of the second mirror.

11. The LD module as set forth in claim 8, wherein:
   the first reflective surface in the light-guiding device reflects, to the outside of the first mirror, a corresponding one of the input beams that are incident on the first mirror from the outside of the first mirror; and
   the second reflective surface in the light-guiding device, reflects, to the outside of the second mirror, the corresponding one input beam that is incident on the second mirror form the outside of the second mirror.

12. A light-guiding device that converts an input beam bundle made of a plurality of input beams to an output beam bundle made of a plurality of output beams, comprising: double mirrors each corresponding to a corresponding one of the input beams, the double mirrors each being separated noncontiguously from the other double mirrors each corresponding to another one of the input beams such that the double mirrors are capable of individually being adjusted with respect to physical orientation thereof,
   the double mirrors respectively corresponding to the input beams each being made of a first mirror that is mounted on a specific flat surface and a second mirror that is mounted on a top surface of the first mirror,
   the first mirror having a first reflective surface whose normal vector makes an angle of 45° with a normal vector of the specific flat surface, the first reflective surface reflecting a corresponding one of the input beams,
   the second mirror having a second reflective surface whose normal vector makes an angle of 135° with the normal vector of the top surface of the first mirror, the second reflective surface reflecting the corresponding one input beam that has been reflected by the first reflective surface.

13. The light-guiding device as set forth in claim 12, wherein:
   the first reflective surface reflects, to the outside of the first mirror, a corresponding one of the input beams that are incident on the first mirror from the outside of the first mirror; and
   the second reflective surface reflects, to the outside of the second mirror, the corresponding one input beam that is incident on the second mirror form the outside of the second mirror.

14. An LD module comprising the light-guiding device as set forth in claim 12.

* * * * *